United States Patent
Huben et al.

(10) Patent No.: US 7,661,050 B2
(45) Date of Patent: Feb. 9, 2010

(54) METHOD AND SYSTEM FOR FORMAL VERIFICATION OF PARTIAL GOOD SELF TEST FENCING STRUCTURES

(75) Inventors: Gary Van Huben, Poughkeepsie, NY (US); Adrian E. Seigler, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 314 days.

(21) Appl. No.: 11/744,392

(22) Filed: May 4, 2007

(65) Prior Publication Data

US 2008/0276144 A1   Nov. 6, 2008

(51) Int. Cl.
*G01R 31/3187* (2006.01)
*G01R 31/40* (2006.01)

(52) U.S. Cl. .................................... 714/733; 714/724
(58) Field of Classification Search .................. None
See application file for complete search history.

(56) References Cited

U.S. PATENT DOCUMENTS

| | | | |
|---|---|---|---|
| 4,862,399 A | 8/1989 | Freeman | 714/738 |
| 6,044,481 A * | 3/2000 | Kornachuk et al. | 714/724 |
| 6,502,190 B1 | 12/2002 | Faver | 713/2 |
| 6,530,049 B1 | 3/2003 | Abramovici et al. | 714/725 |
| 6,550,020 B1 | 4/2003 | Floyd et al. | 714/10 |
| 6,807,645 B2 | 10/2004 | Angelotti et al. | 714/732 |
| 6,885,568 B2 * | 4/2005 | Kernahan et al. | 363/97 |
| 7,111,196 B2 | 9/2006 | Balazich et al. | 714/13 |
| 7,117,415 B2 | 10/2006 | Forlenza et al. | 714/733 |
| 2002/0178425 A1 * | 11/2002 | Abe | 716/5 |
| 2005/0015615 A1 * | 1/2005 | Gonsalves et al. | 713/200 |
| 2005/0138586 A1 | 6/2005 | Hoppe et al. | 716/5 |
| 2007/0005329 A1 | 1/2007 | Alfieri | 703/19 |
| 2007/0050740 A1 | 3/2007 | Jacobi | 716/5 |

OTHER PUBLICATIONS

IBM SixthSense tool (see H. Mony et al.: "Scalable Automated Verification Via Expert-System Guided Transformations", Proc. of Formal Methods inComputer-Aided Design: 5th Int.
Mack Riley et al. "Testability Features of the First-Generation Cell rocessor"Proc International Test Conf Proc, ITC 2005; IEEE International vol., Issue 8-10, (Nov. 2005).
IBM SixthSense tool (see H. Mony et al.: "Scalable Automated Verification via Expert-System Guided Transformations", Proc. of Formal Methods in Computer-Aided Design: 5th International Conference, FMCAD 2004).
Mack Riley et al. "Testability Features of the First-Generation Cell Processor" Proceedings International Test Conference Proceedings, ITC 2005; IEEE International vol., Issue 8-10, 9 pages. (Nov. 2005).

* cited by examiner

Primary Examiner—Kevin L Ellis
Assistant Examiner—Dipakkumar Gandhi
(74) Attorney, Agent, or Firm—John E. Campbell; Graham S. Jones, II

(57) ABSTRACT

The concept of applying fencing logic to Built-In Self Test (BIST) hardware structures for the purpose of segregating defective circuitry and utilizing the remaining good circuitry is a well known practice in the chip design industry. Described herein is a method for verifying that any particular implementation of partial fencing logic actually provides the desired behavior of blocking down-stream impact of all signals from fenced interfaces, and also ensuring that the partial fencing does not inadvertently preclude any common logic from being fully tested.

19 Claims, 14 Drawing Sheets

```
LIBRARY ieee;
USE ieee.std_logic_1154.all;
USE ieee.numeric_std.all;                    ⎫
USE work.std_ulogic_support.all;             ⎬ 70
                                             ⎭

ENTITY macro IS PORT (                       ⎫
   fence : OUT std_ulogic;                   ⎪
   intf_sig1 : OUT std_ulogic;               ⎬ 71
   intf_sig2 : OUT std_ulogic;               ⎪
   neg_intf_sig : OUT std_ulogic);           ⎭

END macro;

ARCHITECTURE macro of macro IS               ⎫
BEGIN                                        ⎪
   fence <= '0';   -- Drive fence inactive   ⎪
                                             ⎬ 72
   intf_sig1 <= '0';  -- Drive intf inactive ⎪
   intf_sig2 <= '0';                         ⎪
   neg_intf_sig <= '1';                      ⎪
                                             ⎪
END macro;                                   ⎭
```

FIG. 6A

```
LIBRARY ieee;
USE ieee.std_logic_1154.all;         ⎫
USE ieee.numeric_std.all;            ⎬ 70
USE work.std_ulogic_support.all;     ⎭

ENTITY macro IS PORT (               ⎫
   fence : OUT std_ulogic;           ⎪
   intf_sig1 : OUT std_ulogic;       ⎬ 71
   intf_sig2 : OUT std_ulogic;       ⎪
   neg_intf_sig : OUT std_ulogic);   ⎭

END macro;

ARCHITECTURE macro of macro IS                       ⎫
BEGIN                                                ⎪
   fence <= '1';   -- Drive fence active             ⎪
                                                     ⎪
   intf_sig1 <= 'X';   -- Randomly drive intf        ⎬ 73
   intf_sig2 <= 'X';                                 ⎪
   neg_intf_sig <= 'X';                              ⎪
                                                     ⎪
END macro;                                           ⎭
```

FIG. 6B

```
LIBRARY ieee;
USE ieee.std_logic_1154.all;        ⎫
USE ieee.numeric_std.all;           ⎬ 70
USE work.std_ulogic_support.all;    ⎭

ENTITY macro IS PORT (                              ⎫
   fence       : OUT std_ulogic;                    ⎪
   intf_sig1   : OUT std_ulogic;                    ⎪
   intf_sig2   : OUT std_ulogic;                    ⎪
   neg_intf_sig : OUT std_ulogic;                   ⎬ 74
   macro1_misr : IN std_ulogic_vector(0 To 29);     ⎪
   macro2_misr : IN std_ulogic_vector(0 To 29);     ⎪
   fail        : OUT std_ulogic);                   ⎪
END macro;                                          ⎭

ARCHITECTURE macro of macro IS                      ⎫
Signal misr : std_ulogic_vector(0 To 59);           ⎪
BEGIN                                               ⎪
   fence <= '1';   -- Drive fence active            ⎬ 75
                                                    ⎪
   intf_sig1 <= 'X';  -- Randomly drive intf        ⎪
   intf_sig2 <= 'X';                                ⎪
   neg_intf_sig <= 'X';                             ⎭
```

FIG. 7A

```
--!! BUGSPRAY
--!! DESIGN ENTITY: macro.macro;
--!! INPUTS
--!! macro1_misr => chip.macro1.lfsr_misr_srl;
--!! macro2_misr => chip.macro2.lfsr_misr_srl;
--!!    FAIL OUTPUTS
--!!       0 : "misr instability during clkg";
--!!    END FAIL OUTPUTS ;
--!! END BUGSPRAY misr(0:59) <= macro1_misr(0:29) &
                macro2_misr(0:29);
  fail   <= mvl_is_any_X(misr);

END macro;
```

METHOD AND SYSTEM FOR FORMAL VERIFICATION OF PARTIAL GOOD SELF TEST FENCING STRUCTURES

BACKGROUND OF THE INVENTION

Field of the Invention

This invention relates to methods, systems and program products for verifying the behavior of designed circuit components related to fencing (or gating) of partial good Logical Built-In Self Test (LBIST) structures.

TRADEMARKS

IBM® is a registered trademark of International Business Machines Corporation, Armonk, N.Y., U.S.A. Other names used herein may be registered trademarks, trademarks, or product names of International Business Machines Corporation or other companies.

DESCRIPTION OF BACKGROUND

Logic Built-In Self Test (LBIST)

Self-testing of chips by the Logic Built-In Self Test (LBIST) function is an inherent part of contemporary chip design and fabrication processing. With the increasing density of chip dies, it is now a routine action to implement a plurality of self-contained units, cores, or even systems within a single physical chip boundary. In a multiple core microprocessor, two or more independent processors, conventionally referred to as cores, are contained in a single package, such as an Integrated Circuit (IC). The most prominent example in industry is the inclusion of multiple processor cores on a single CPU chip. In these situations, running LBIST on the entire chip is adequate to ascertain whether the whole die is functional, and can even be used to identify a failing portion of a chip.

Partially Good Chip and Partial LBIST Fencing

However, to enable the use of a partially good chip (such as a case where only one core is damaged and all the damage is contained within the boundaries of that one core), the design must implement the concept of partial LBIST fencing. Fencing refers to separating nodes of an electronic device which are permitted to have access to a shared resource from nodes which are prohibited from having access to the shared resources.

Partial LBIST fencing allows for self-contained units, cores, or boundaries of a chip to be electrically isolated from the remainder of the chip in cases where such an area is damaged. In this manner, a procedure is employed wherein if the LBIST of the entire chip indicates damage, and the damage is isolated in specific regions of the chip (such as one or more cores on a CP chip), then partial fences can be used for electrically quarantining the affected regions. Running LBIST on the partially fenced chip will then yield a different signature from the full chip signature. However, the partial LBIST signature will be repeatable assuming that the remainder of the chip is functional and that the partial fencing is implemented properly.

Since the damaged area will likely be powered down, the risk exists that the interfaces connecting the damaged area to the remainder of the chip are electrically unpredictable. Therefore, it is imperative that the partial fencing be implemented correctly since just one missing fencing gate on an interface signal could result in signature mismatches. In turn, this would result in discarding of perfectly usable partial chips during the fabrication process.

Mack Riley et al. "Testability Features of the First-Generation Cell Processor" Proceedings International Test Conference Proceedings, ITC 2005; IEEE International Vol., Issue 8-10, 9 pages, (November 2005) describes and explains subject matter relevant to partial good processing elements and Built In Self Test (BIST) engines.

The concept of partially good elements is well known in the industry and the following patents provide additional background, which is related to, but fails to teach the subject matter of the present invention. For example, commonly assigned, U.S. Pat. No. 6,550,020 of Floyd et al. entitled "Method and System for Dynamically Configuring a Central Processing Unit with Multiple Processing Cores" (hereinafter Floyd) reinforces the complexities of dealing with partially good processor cores in a computer system. Floyd provides a means for dynamically detecting whether one or more processors cores are defective at run-time, and then taking appropriate steps to remove the defective cores from the system, and to allow for seamless interaction with the operating system.

This invention presumes a means already exists in the design of the cores to permit the cores to be analyzed for defect during the manufacturing process. Not only do they fail to elaborate on the design of internal test and partial good fencing structures of the cores, but their invention completely neglects any reference to verification of the structures. It should be noted that the present invention can be used as a means of verifying the partial good fencing gates (244A & 244B) shown in FIG. 2 of Floyd.

Similarly, U.S. Pat. No. 6,530,049, of Abramovici et al., entitled "On-Line Fault Tolerant Operation Via Incremental Reconfiguration of Field Programmable Gate Arrays" (hereinafter Abramovici) also relates to partially good hardware structures, but it relates mainly to Field Programmable Gate Arrays (FPGA). This invention teaches a method of reconfiguring the logic structures within the FPGA to be self-test structures capable of finding defects during normal run-time operation. Spare logic structures can then be dynamically reconfigured to assume the role of the structures found to be defective, thereby restoring full functionality of the FPGA. Although Abramovici deals with partial good concepts, it is suitable only for reprogrammable logic structures such as gate arrays, and therefore falls short in applicability to designs such as microprocessor cores which contain complex BIST structures and sequences built into the device for self-testing.

U.S. Pat. No. 4,862,399 of Freeman entitled "Method for Generating Efficient Testsets for a Class of Digital Circuits" (hereinafter Freeman) teaches a method for generating efficient test vectors in order to detect faults in logic design structures. The Freeman approach requires the design to be configured as a plurality of functional blocks in which test vectors are generated that create a one-to-one correspondence between the inputs and outputs of the functional block such that no two input patterns produce the same output pattern. By formulating such a relationship, mathematical modeling guarantees that for a given input pattern, an output pattern differing from the expected output pattern is evidence of a logic fault.

Although the Freeman method is very useful in Design For Test (DFT) applications, it falls short on teaching the elements of the present invention. For example, it focuses on generating test vectors, and analyzing the design to improve the design, whereas the present invention specifically targets the verification of designs with self-test and fencing structures already implemented. Furthermore, Freeman requires alterations to the design in order for it to be properly partitioned into the required F-Paths. The present invention is directed at verification of an existing design and requires no alteration to the design source in order to exercise the method steps thereof.

Commonly assigned U.S. Patent publication No. 2005/0138586 of Hoppe et al. entitled "Method for Verification of Gate Level Netlists Using Colored Bits" (hereinafter Hoppe) teaches a method for verifying gate level netlists via the use of so-called "colored" bits. As compared to prior art symbolic simulation, the bit coloring scheme taught by the Hoppe method solves the "explosion of symbolic expressions" problem via arbitrary assignment of "crunched colors" to any expression containing more than one symbol. The Hoppe method then performs symbolic simulation using the crunched color information expressions instead of the original, more complex expressions. While this approach reduces the general analytic capabilities as compared to traditional symbolic simulation, it has the benefit of reducing symbolic complexity. Thus, the approach lends itself to be applied to certain verification tasks such as checking the influence of logic in one domain upon another domain; for example, fencing logic.

However, at its root, Hoppe teaches a simulation method which is an under-approximate technique with regard to verifying design behavior. That is, since it is impractical to exercise all combinations of inputs and internal states exhaustively via simulation in most real world designs, this precludes the possibility of obtaining proofs for the verification properties of interest. Also, simulation often poses the need for one to develop relatively complex test benches in order to avoid driving invalid input vector combinations and to ensure "interesting" and "corner case" scenarios are tested. In contrast, the method of this invention exploits the power of formal verification to provide complete proofs. The method of the present invention is also highly scaleable, and eliminates the need to drive complex sequences that would be required when attempting to verify the design with simulation.

U.S. Patent application US2007/005329 of Alfieri entitled "Building Integrated Circuits Using a Common Database" describes a method for building integrated circuits using a common database generated from a high-level language. Within the description of the this method, Alfieri states that a chip produced from the high-level language includes units from two different classes known as Paradigm Logical Units (PLUs) and Computation Logical Units (CLUs), and that it is possible to formally verify the register Transfer Level (RTL) model for a PLU in a piecewise fashion. Alfieri states that the constraints used in the piecewise formal verification may be automatically generated for each portion of the PLU or for an entire PLU. However, Alfieri does not elaborate on how this automatic constraint generation is performed, or on the general process of creating a formal verification testbench including which rules will be verified and how the process of generating a set of rules for any PLU occurs. Similarly to the Floyd patent, above, Alfieri makes no mention of the design of internal test and partial good fencing structures, nor is there any reference to verification of the structures.

U.S. Pat. No. 6,502,190 of Faver entitled "System and Method for Computer System Initialization to Maximize Fault Isolation Using JTAG" (hereinafter Faver) teaches computer system initialization to maximize fault isolation using JTAG interfaces. This method addresses the problem of trying to identify and to debug failures that can occur during power-up and initialization of computer systems, since fault isolation mechanisms within the system are typically not all enabled until initialization has successfully completed. As part of the Faver method, BIST functions are initiated and monitored for status by a service processor via JTAG interfaces. Thus, Faver presumes the existence of a fully verified BIST design which may or may not include partial fencing. In contrast, the present invention teaches a method for proving that the design implementation of any partial fencing logic behaves as intended, for any BIST design. Application of the method of this invention is ideally done prior to initial chip release. However, the Faver method has meaningful application only at the system level; either in a real system after hardware is built, or in a suitable system simulation environment capable of running the sequences taught by Faver.

Commonly assigned U.S. Pat. No. 6,807,645 of Angelotti et al. entitled "Method and Apparatus for Implementing Enhanced LBIST Diagnostics of Intermittent Failures" describes a method and apparatus are provided for enhanced Logic Built in Self Test (LBIST) diagnostics. First multiplexers are respectively coupled between adjacent sequential channels of a plurality of sequential channels under test. Each of the first multiplexers selectively receives a first data input in a first scan mode with the sequential channels configured in a common scan path and a second data input in a second scan mode with each of the sequential channels configured in a separate scan path responsive to a first control signal. A first multiple input signature register (MISR) including multiple MISR inputs is coupled to a respective one of the plurality of sequential channels under test. A blocker function is configured for blocking all MISR inputs except for a single MISR input receiving the test data output of the last sequential channel responsive to a recirculate control signal. A second MISR shadow register is coupled to the first multiple input signature register. A pseudo random pattern generator (PRPG) is coupled by a plurality of first multiplexers (MUXs) to a respective one of multiple channels under test.

Commonly assigned U.S. Pat. No. 7,117,415 of Forlenza et al. entitled "Automated BIST Test Pattern Sequence Generator Software System and Method" describes methods and systems for reducing the volume of test data associated with Built In Self Testing (BIST) test methodologies (e.g., logical BIST, array BIST, etc.) and pattern structures are provided. A limited number of "dynamic" test parameters are stored for each test sequence that have changed relative to a previous test sequence. The LBIST circuitry typically includes a Pseudo Random Pattern Generator (PRPG) designed to generate test patterns to be applied to inputs of scan chains formed in the circuitry under test and a Multiple-Input Signal Register (MISR) to receive signals output from the scan chains. An LBIST controller generates all necessary waveforms for repeatedly loading pseudorandom patterns from the PRPG into the scan chains, initialing a functional cycle (capture cycle), and logging output responses into the MISR. The MISR compresses accumulated responses (from multiple cycles) into a code referred to as a signature. Any corruption in the final signature at the end of the test sequence indicates a defect in the device.

Commonly assigned, U.S. Patent publication No. 2007/0050740 of Jacobi et al. entitled "Method and System for Performing Functional Formal Verification of Logic Circuits" (hereinafter Jacobi) refers to the IBM SixthSense tool (see H. Mony et al.: "Scaleable Automated Verification via Expert-System Guided Transformations", Proc. of Formal Methods in Computer-Aided Design: 5th International Conference, FMCAD 2004). Jacobi describes use of an equivalence checking portion of a formal verification tool; but it differs from the present invention as it does not attempt to prove equivalence between two behavioral representations of the same design that should behave logically equivalently. Instead, Jacobi tries to measure fault coverage of a design by modifying the design netlist to emulate various stuck at and transient faults. In summary Jacobi is directed to ascertaining a quality metric (design test coverage) whereas the present invention is directed to verifying the design point and to proving implementation correctness.

The present invention is described with reference to the aforementioned prior art and former elements of the present invention will be disclosed which provide uniqueness that is not present within any of referenced publications, either when taken as individual bodies or applied collectively in any combination.

SUMMARY OF THE INVENTION

Historically, logic simulation has been employed to verify LBIST by functionally exercising the LBIST procedure to obtain and check the signature. This approach entails initializing and sequencing through a complex process which is typically very time consuming for verification engineers to get running.

The present invention employs a formal verification method based on obtaining a mathematical proof of equivalence as opposed to executing a deterministic or prescribed simulation routine. The present invention further employs a formal verification engine to prove that a chosen reference point in the design is logically equivalent when the design is compared under two modes of operations. The comparison is done using two models of the Design Under Test (DUT) wherein one or more interfaces are identified as a partial good boundary. For example, in the case of partial good CP cores, the chosen interlace would be the signals connecting the cores to the common logic.

The first model represents the design in a normal mode of system operation such that the partial good fences are inactive and the chosen interfaces are in an inactive state. The second model represents the design operating in a partial good scenario wherein the partial fences are active and the chosen interfaces are randomly driven to emulate electrical unpredictability.

The present invention provides a means of verifying the chosen interfaces are property fenced by demonstrating the two models are logically equivalent. In our preferred embodiment, the reference point of equivalence is the Multiple Input Signature Register (MISR) which houses the LBIST signature. By ensuring the MISR latches are equivalent in the two modes of operation, it demonstrates that a properly fenced interface behaves identically to an inactive interface.

The method, system, and program product described herein provides a robust method of verifying the behavior of designed circuit components related to fence gating signals of partial good Logical Built-In Self Test (LBIST) structures.

Additional features and advantages are realized through the techniques of the present invention. Other embodiments and aspects of the invention are described in detail herein, and are considered a part of the claimed invention. System and computer program products corresponding to the above-summarized methods are also described and claimed herein. For a better understanding of the invention with advantages and features, refer to the description and to the drawings.

Technical Effects

As a result of the summarized invention, technically we have achieved a solution which potentially enhances chip yield by providing a method of verifying the behavior of designed circuit components related to fence gating signals of partial good Logical Built-In Self Test (LBIST) structures.

BRIEF DESCRIPTION OF THE DRAWINGS

The subject matter which is regarded as the invention as particularly pointed out and distinctly claimed in the claims at the conclusion of the specification. The foregoing and other objects, features, and advantages of the invention are apparent from the following detailed description taken in conjunction with the accompanying drawings in which:

FIGS. 6A and 6B show Model 1 and Model2 testbench drivers respectively, which are used to stimulate the models in the present invention.

FIGS. 7A and 7B are a single continuous diagram of the Model 2 testbench driver modified to include the "X" State Rule.

The detailed description explains the preferred embodiments of the invention, together with advantages and features, by way of example, with reference to the drawings.

DETAILED DESCRIPTION OF THE INVENTION

Figure 1:
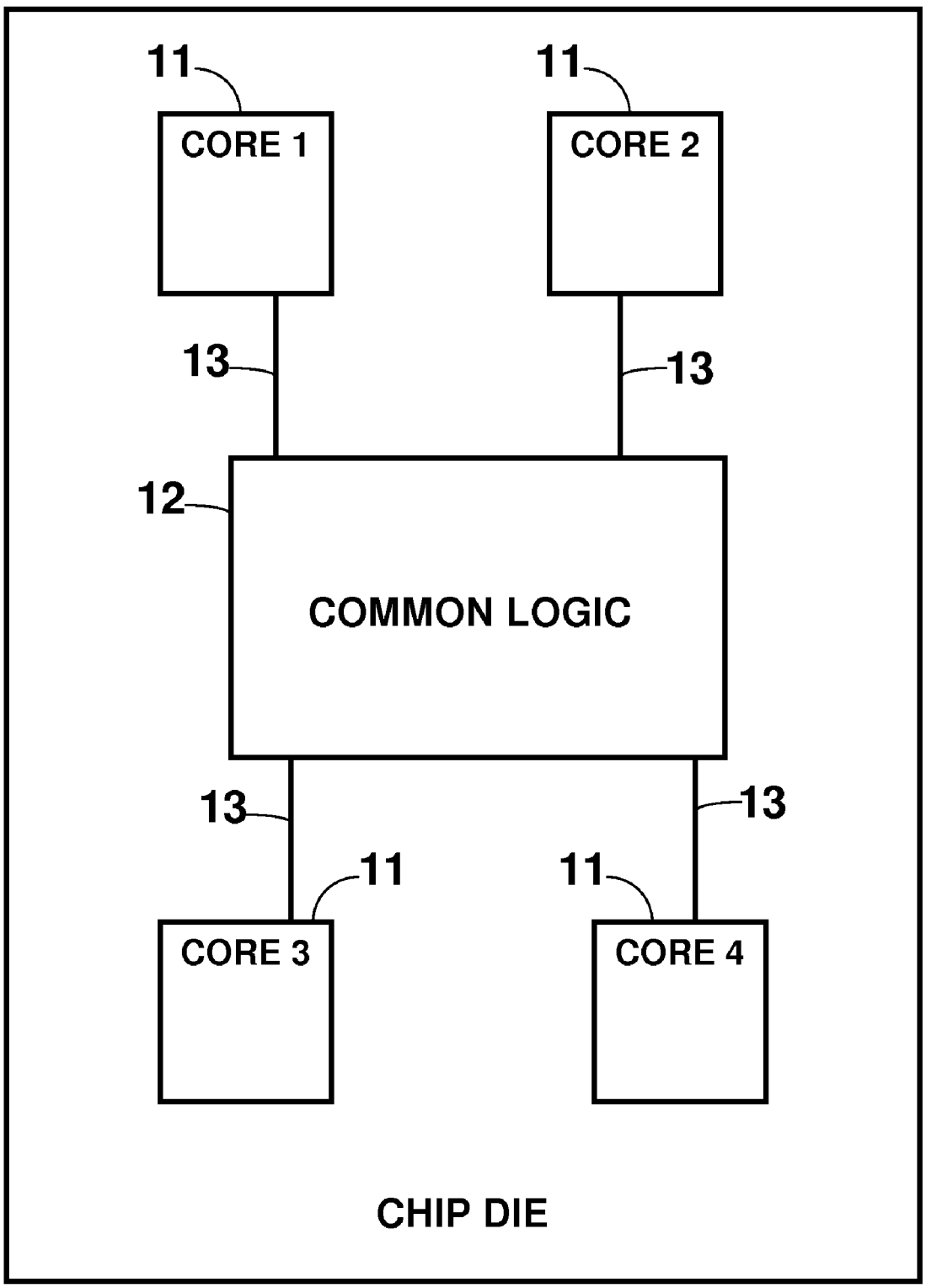
FIG. 1 illustrates an example of a typical chip die showing a plurality of processors referred to as cores interfacing with common logic.

Turning now to the drawings in greater detail, FIG. 1 depicts an example of the preferred embodiment wherein a chip die 10 is comprised of a plurality of processors, commonly referred to as cores 11, and a common logic block 12. In the preferred embodiment, the cores 11 are independent units which process streams of executable code. Each core is a replicated instance of a master design component, and although FIG. 1 shows four cores on chip die 10, one skilled in the art can appreciate how this number can vary upwards from two depending on the size of the chip die 10 and the density of the fabrication technology.

FIG. 1 shows each core 11 communicating with the common logic block 12 via interfaces 13, in an arrangement sometimes known as the nest, memory subsystem, or storage hierarchy. This logic comprises elements shared by the cores 11 such as cache, embedded dynamic random access memory (eDRAM), I/O interfaces, discrete memory interfaces, firmware portals, interrupt and error handlers, pervasive structures, and semaphore or messaging devices for maintaining system coherency. These pervasive and shared components are accessible from each core 11 through their individual interfaces 13 into the common logic block 12.

Chips of the complexity shown in FIG. 1 are sometimes referred to as System On a Chip (SOC), since they often contain all the necessary elements within the boundaries of the chip die 10. At the frequencies common in computer systems today, fabrication techniques are far from perfect and defects are commonplace in the chip die 10. When the defects manifest in the common logic block 12, the functionality of the entire chip die 10 is often compromised, thereby resulting in the chip being discarded. However, if the defects are contained within a core 11, or even several cores, it is often possible to utilize the chip die 10 in a degraded fashion as long as a minimum number of cores are fully operational.

One of the most common methods for determining the presence of defects on a chip die is Built-In Self Test (BIST). There are two types of BIST required to examine the various structures present on a chip die. Logic Built-In Self Test (LBIST) focuses on logic gates, latches and clock distribution networks, while Array Built-In Self Test (ABIST) exercises random access memories (RAMs). The combination of these two test methods allows for discovery of most defects in the chip die 10.

Figure 2A:
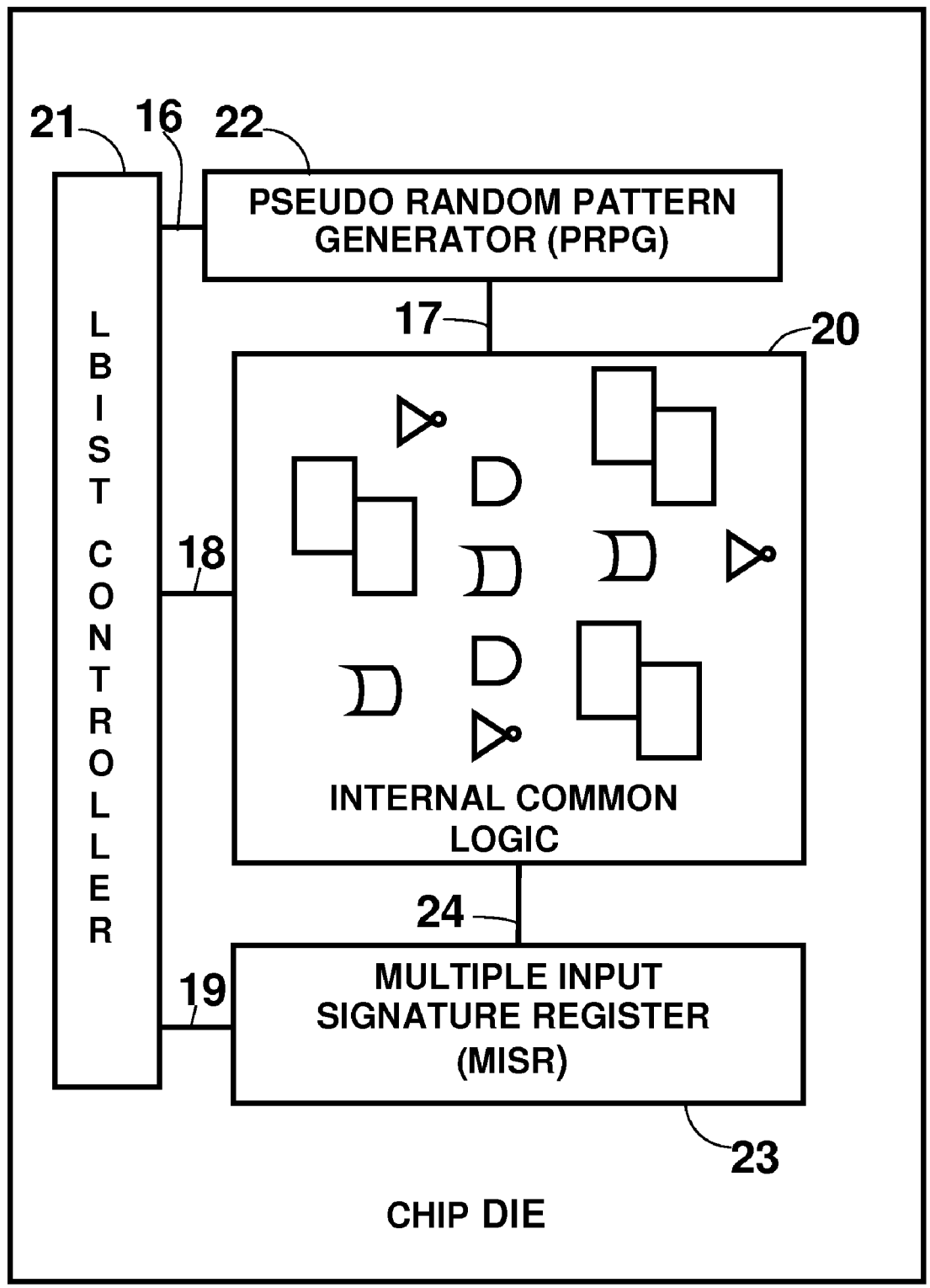
FIGS. 2A-2B illustrate the common test structures necessary to employ Logic Built-In Self Test (LBIST).

For complex chips such as multiple processor cores or complete systems on a chip (SOC), the prevailing LBIST technique in use today relies on obtaining a matching signature using a deterministic set of test vectors. FIG. 2A illustrates the main components of the LBIST method. The internal logic 20 which is a structure under test is flanked by a LBIST Controller 21, a Pseudo Random Pattern Generator (PRPG) 22, and a Multiple Input Signature Register (MISR) 23. These test structures reside on the chip die 10 along with the internal logic under test 20. The internal logic 20 under test represents the various components, shown in FIG. 1, including the logic gates and latches comprising the cores 11 and common logic block 12.

The Pseudo Random Pattern Generator (PRPG) 22 is initialized with a predefined test vector, or seed. A Linear Feedback Shift Register (LFSR) with an input bit which is a linear function of its previous state, as will be well understood by those skilled in the art, is employed within the PRPG 22 to recombine the PRPG bits and repeatedly generate new patterns. Analytical software is typically used to determine the required number of pattern iterations necessary to exercise all phases of the internal logic 20 under test in an effort to discover any stuck faults due to open or short circuits, as well as finding AC defects due to insufficient timing margins.

The LBIST Controller 21 which is connected by link 16 to PRPG 22 manipulates the clock distribution network to propagate the PRPG pattern via link 17 through the internal logic 20 and via stumps channel 24 into a Multiple Input Signature Register (MISR) 23. Each PRPG pattern results in an expected bit pattern being loaded into the MISR 23. The MISR 23 employs the same Linear Feedback Shift Register (LFSR) as the PRPG 22 to combine the incoming pattern with me current MISR value resulting in a compressed signature mathematically. The current MISR pattern is repeatedly combined with the results of each new PRPG pattern, until the final PRPG pattern is propagated. Upon final propagation, the MISR contains an analytically predictable signature which is unique for the given internal logic structure under test 20. When all the logic is properly fabricated without defects, the final MISR will match the predicted signature and the chip is deemed good. In the case where the final MISR mismatches the predicted signature, it indicates the presence of a defect and the chip cannot be fully utilized.

The LBIST Controller 21 is connected to the internal common logic by control bus 18 and to the MISR 23 by control bus 19, which represent the connections between the LBIST controller and the internal logic and test structures. Control bus 18 is the conduit for the LBIST controller to manipulate the system and scan clocks for all the latches in internal logic 20 in order to execute the various test sequences defined in the LBIST procedure. Likewise, control bus 19 manipulates the clocks for the MISR 23 to permit loading of the internal latch contents into the MISR via the STUMPS channels 24.

Figure 2B:
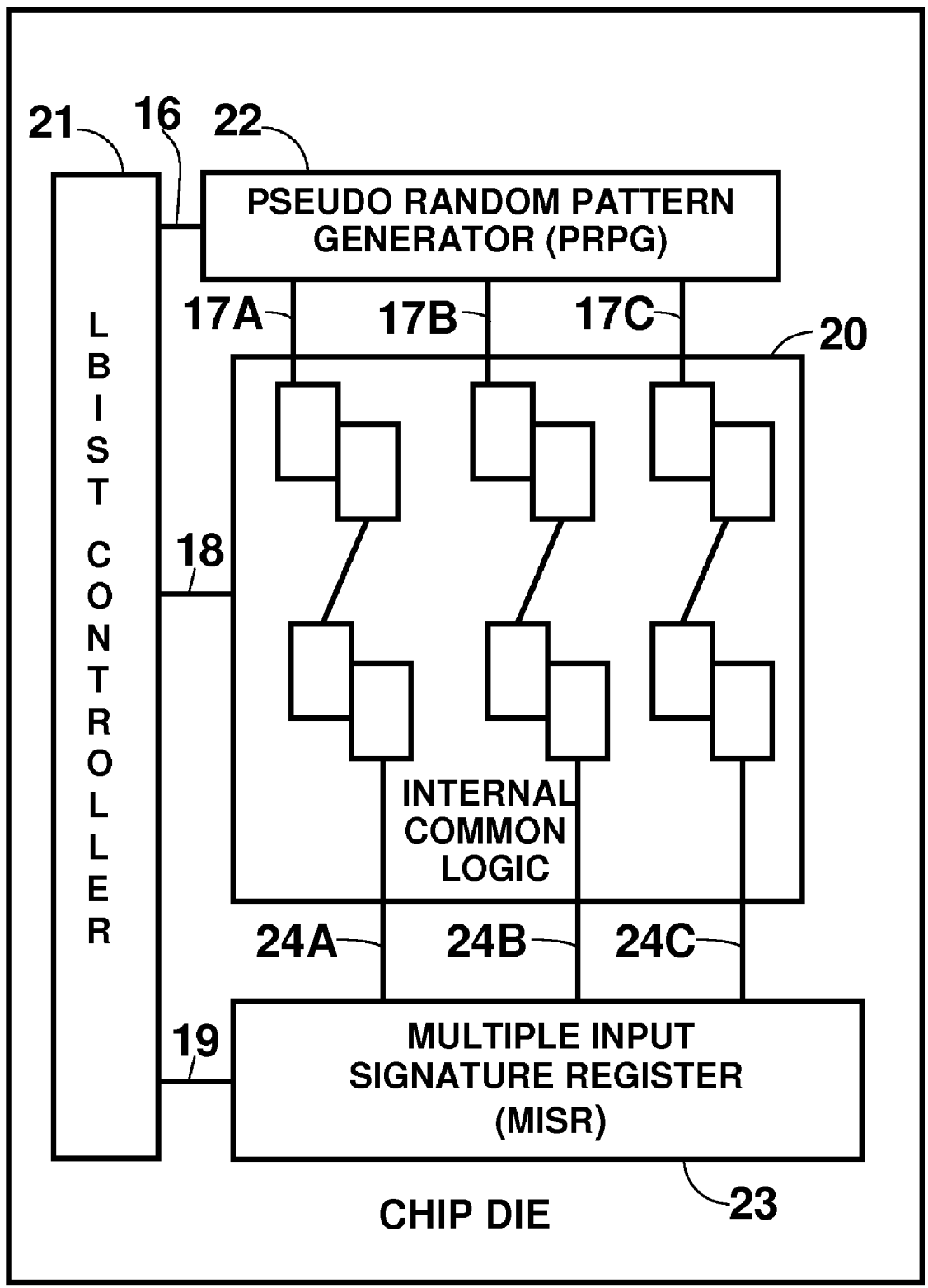

FIG. 2B shows the grouping of the larches of the internal logic 20 into stumps channels 24A-24C. A plurality of latches is connected into a single scan chain to create a stumps channel 24A, 24B, or 24C. There ate usually too many latches in the internal logic 20 to be connected into one long stumps channel 24A, 24B or 24C, so typical MISRs 23 are constructed to handle a multitude of stumps channels 24A, 24B and 24C. The longer a stamps channel 24A, 24B or 24C, the more time it takes to scan each PRPG pattern into the latches, and subsequently scan the resulting pattern out of the latches into the MISR 23.

A preferred embodiment of this invention employs the LBIST Controller 21 to govern the following sequence of events. 1) The PRPG 22 and MISR 23 are initialized to a predetermined state. 2) The LBIST Controller 21 sequences the scan clocks to shift the PRPG pattern into the latches on each stumps channel. Simultaneously, the result of the previously applied pattern is compressed from the latches into the MISR. 3) The LBIST Controller 21 activates the system clocks to exercise the combinatorial logic interconnecting the latches, and to capture the outputs of the combinatorial logic into the latches. 4) The LBIST Controller 21 sequences the scan clocks to shift the latch values through the stumps channel 24 scan chains and into the MISR 23. 5) The aforementioned steps repeat for a predetermined count mathematically calculated to maximize the test coverage. 6) The final MISR 23 value is unloaded and compared to the predicted signature.

For simplistic chips, the internal logic 20 represents all the latches and combinatorial logic on the chip. A mismatching MISR signature results in an unusable chip which must be discarded. However, for complex chips such as that of the preferred embodiment's chip die 10, it would be wasteful to discard the entire chip if a defect is contained within a core 11. These chips utilize a multitude of LBIST Controllers 21, PRPGs 22 and MISRs 23 to test portions of the chip separately. For example, each core 11 has its own set of test structures shown in FIG. 2B. Any core 11 found to have a mismatching signature can usually be disabled and as long as the common logic block 12 is defect free, the chip die 10 can still be used in a degraded fashion.

As previously stated, if the common logic block 12 is found to have a defect the chip die 10 normally must be discarded. But in cases where one or more cores 11 is defective, the defective core 11 must be disabled during the LBIST testing of the common logic block 12, otherwise the core defect could propagate an erroneous value across the interface into the common logic block 12 and cause a false mismatch of the common logic MISR 23. This could result in the inappropriate dismissal of the chip die 10 because the common logic block 12 is inadvertently classified as defective. In order to prevent the inadvertent clarification of the common logic block 12 as defective, all defective cores 11 are disabled during LBIST testing of the common logic block 12. However, the functional absence of one or more cores 11 leaves the corresponding interfaces to the common logic electrically unstable. This can also create false fails in the common logic MISR 23 if an electrical fault arises on an improperly terminated interface signal.

In order to avoid these false fails, complex systems employ a more advanced form of LBIST known as partial good LBIST. This technique requires that components, which can be tested and evaluated independently, must have their common logic interfaces properly gated during the LBIST process. This gating, also known as partial good LBIST fencing, prevents any spurious electrical transitions from propagating through the interface and into the common logic when the driving core 11 is disabled due to a defect. Since the interface is non-functional during LBIST, the internal common logic 20 associated with the non-functional interface will behave differently, and likely manipulate the MISR 23 to a different final signature. However, as long as the common logic block 12 is defect free, then the final signature will be predictable. Thus, as part of the partial good LBIST strategy, there are pluralities of predicted MISR signatures for all combinations of good and bad cores 11.

One skilled in the art will appreciate that the increasing complexity of systems and multiple processing cores 11 on a single chip die 10 require even more advanced LBIST techniques which are beyond the scope of our teachings. Additional information pertaining to advanced test structures and BIST techniques is commonly known and available in the public domain. Regardless of how advanced the LBIST techniques are, the present invention provides a means of verifying the fencing (or gating) logic required by any design employing partial good components.

Positive Latch Fencing

Figure 3A:
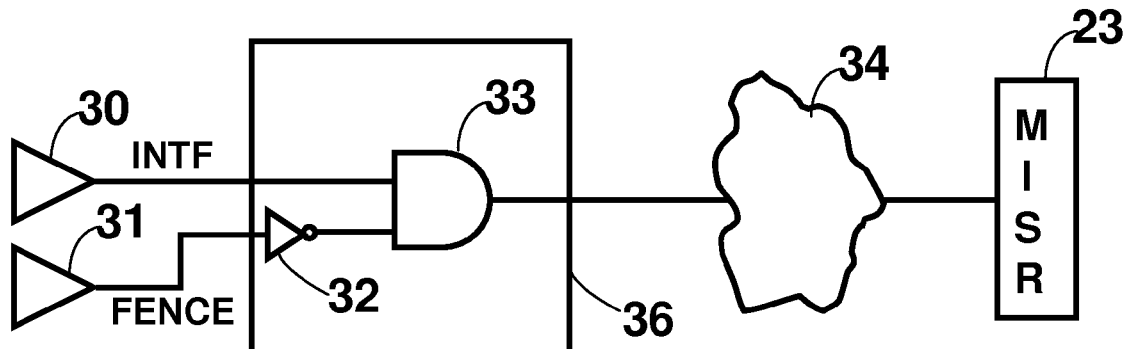
FIGS. 3A-3C shows several ways to implement fencing structures for partial good interfaces.
Figure 3B:
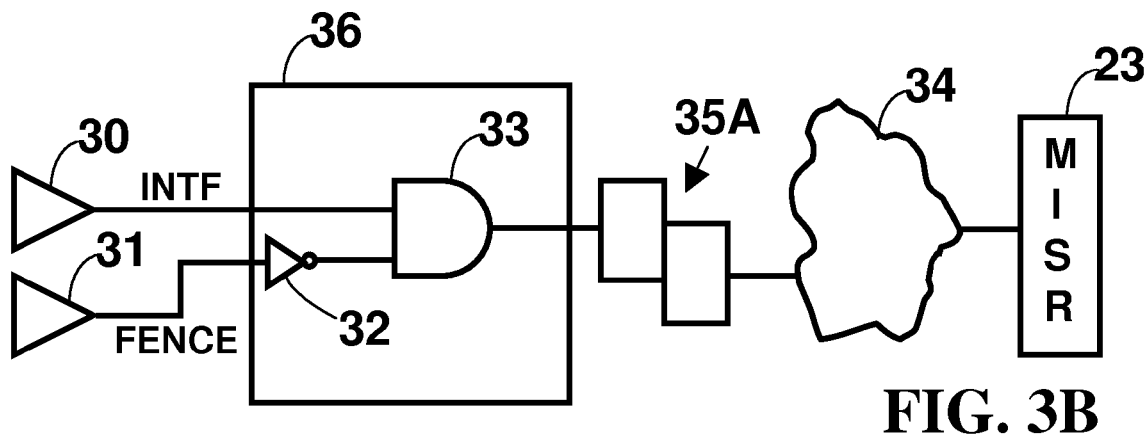
Figure 3C:
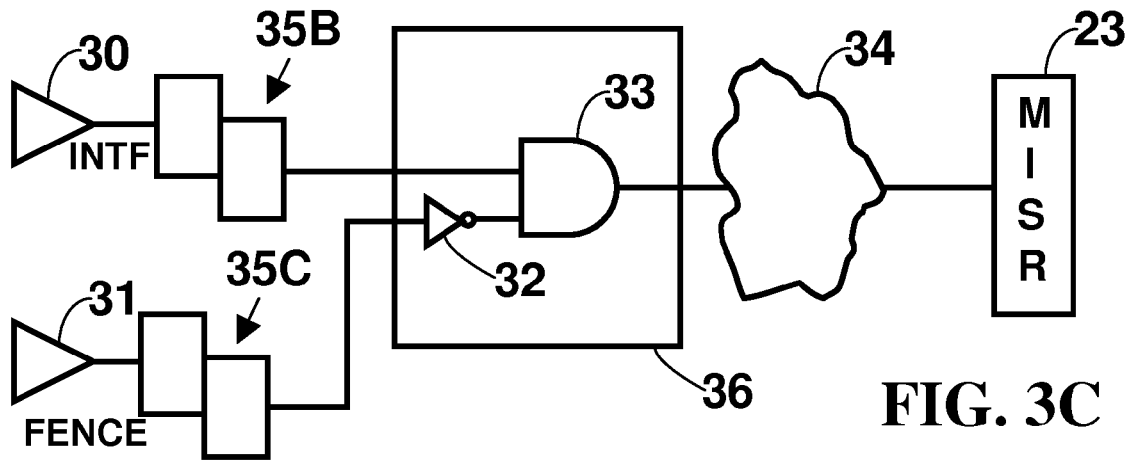

Referring to FIGS. 3A through 3C, the present invention contemplates three different fencing implementations.

FIG. 3A depicts the most common and simplest case involving some interface signal from an interface gate 30 and a corresponding "FENCE" signal from a fence gate 31. The "INTF" signal from the interface gate 30 is logically combined with the FENCE gating signal from fence gate 31 using the inverter 32 and the AND gate 33 which form the fencing logic 36. The fencing logic 36 allows the INTF signal to propagate when the fence gate 31 is inactive, but blocks the INTF signal when the fence gate 31 is active. Beyond the fencing logic 36, if the fence gate 31 is inactive, the INTF signal enters into the internal common logic 34 where it performs the desired function. Eventually the INTF signal 30 interacts with latches and gates within the internal common logic 34 to influence the signature in the MISR 23.

In the event the INTF signal from the interface gate 30 becomes electrically unstable (such as the absence of a driving circuit due to a disabled core 11), the fencing logic 36 will generate a FENCE gating signal which will turn off AND gate 33 which will ensure that no spurious transitions propagate through the internal common logic 34, thereby preventing corruption of the MISR signature.

Although FIG. 3A depicts the most common type of interface fencing structure, the present invention contemplates the use of alternate embodiments shown in FIGS. 3B and 3C.

FIG. 3B shows the same structure as FIG. 3A, which has been modified by the introduction of staging latch 35A. The staging latch 35A is typically inserted if the INTF signal from the interface gate 30 is in a critical path that is unable to meet the design timing constraints. Logically, FIG. 3B functions identically to FIG. 3A as the FENCE gating signal from the fence gate 31 will block any interface instability from propagating into the staging latch 35A, and ultimately downstream into the MISR 23.

FIG. 3C is again functionally identical to the structure in FIG. 3A, and it provides a solution for the most difficult timing closure situations where the INTF signal from gate 30 and the FENCE gating signal from fence gate 31 both require their own, intermediate, respective staging latches 35B/35C to capture the signals prior to applying the INTF and FENCE gating signals to the fencing logic 36. In the case that the output of the fencing logic 36 is off, the INTF signal is connected to the internal common logic 34 which connects to the MISR 23 as in FIG. 3A. Although not explicitly shown, one skilled in the art can appreciate how FIGS. 3B and 3C can be combined into further embodiments such as FIG. 3C with a third staging latch (not shown) at the output of AND gate 33 to provide latch to latch paths bounding the fencing logic 36.

It should also be noted that all the structures from FIG. 3A-FIG. 3C assume positive polarities for the INTF 30 and FENCE gating signals 31. It should be apparent to one skilled in the art that the present invention can also accommodate the logical inversions required to the fencing logic 36 in the cases where either the INTF signal 30 or FENCE gating signal 31 (or both) are asserted as negative polarities. Furthermore, the present invention does not preclude the use of differential pairs, bi-directional, or any other means of transmitting the INTF signals 30 and FENCE gating signals 31 from the cores 11 to the common logic block 12.

Negative Latch Fencing

Figure 4A:
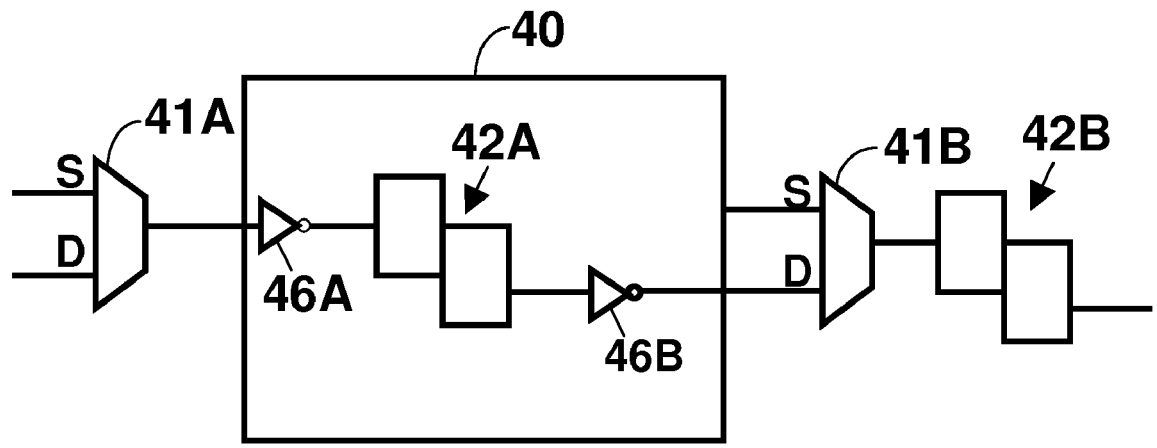
FIGS. 4A and 4B depict alternative latch implementations including inverted latches and latches with inversions in the scan chain.

In addition to accommodating any polarity of the signals, the present invention also contemplates a multitude of embodiments regarding the latch types and the scan chain interconnections of the latches. FIGS. 2 through 3C all imply positive polarity latches such as typical industry standard flip-flops. However, it is sometimes desirable to employ negative active latches. FIG. 4A shows a common implementation of a negative latch 40. A multiplexer 41A selects the latch input to negative latch block 40 between the functional data port D and the scan port S. In the negative latch block 40, the input is inverted by inverter 46A prior to entering the negative latch 42A. Upon leaving the negative latch 42A, the data is inverted back again by a second inverter 46B to its original value. The output of inverter 46B is connected to the data port D of the multiplexer 41B, which selects the latch input to a positive active latch 42B between the functional data port D and the scan port S thereof. Positive active latch 428 is shown in FIG. 4A to illustrate the possibility for negative and positive active latches to coexist in the same design.

Figure 4B:
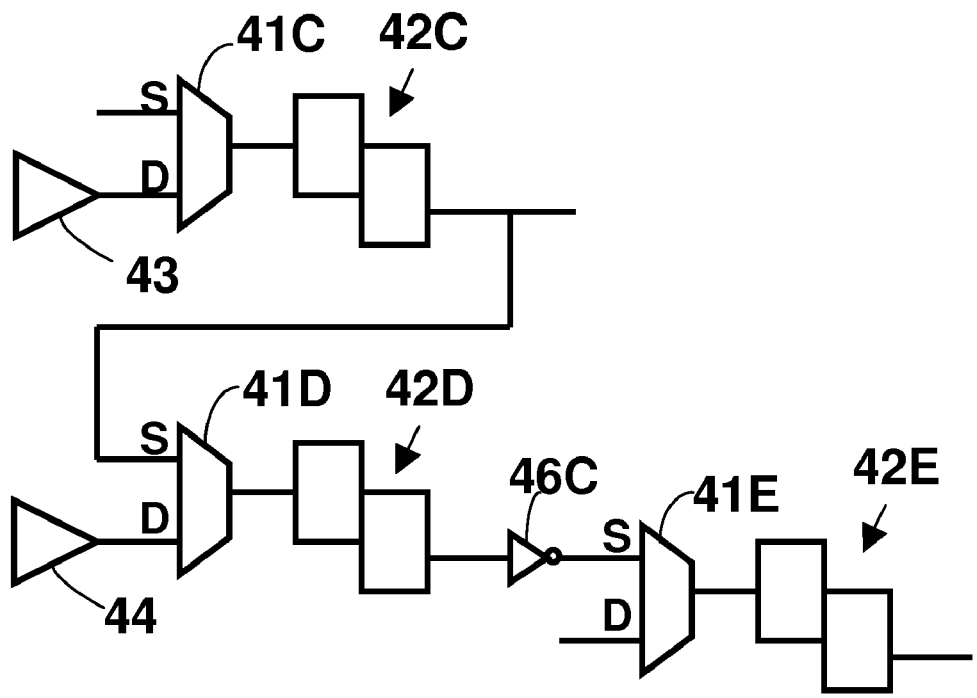

FIG. 4B shows another potential design variation, which involves inversions in the scan chain. A gate 43 is connected to the data port D of multiplexer 41C and a gate 44 is connected to the data port D of multiplexer 41D. The output of the multiplexer 41C is connected to the input of latch 42C and the output of the multiplexer 41D is connected to the input of latch 42D. Thus the multiplexer 41C selects the latch input to latch 42C; and another multiplexer 41D selects the latch input to latch 42D. FIG. 4B shows three positive active latches 42C, 42D and 42E interconnected on a scan chain. The first two positive active latches 42C and 42D are connected in the typical non-inverting fashion to receive inputs from the outputs of multiplexers 41C and 41D, but the third latch 42E which receives its input from multiplexer 41E has the scan port S of multiplexer 41E inverted by inverter 46C, which receives the output from latch 42D. This technique is required in order to initialize latches 42E to a non-zero value by performing a scan flush operation. A scan flush operation simply propagates a logical "0" continuously through the entire scan chain. Latches such as 42C and 42D, without inversions will receive the logical "0" while latches such as 42E with inversions in their scan chain will receive a logical "1."

Verification

It is necessary to verify the operability of the fencing structures because of the problem of the sheer volume of fencing structures required, coupled with the fact that the fencing gates are not exercised in a normal (fully functional) system path, which increases the risk that design errors may have led to missing (or erroneously implementing) a fencing gate, arid therefore rendered the whole partial LBIST strategy unusable.

The fencing structures shown in FIGS. 3A-3C are normally very simple to implement, however they are historically difficult to verify. The first hurdle is the sheer volume for a large complex chip design. Even a single missing AND gate among the thousands of potential interface signals could severely impede the chip fabrication process. The second problem is the manner by which verification on these types of structures is normally applied. The usual method entails simulating the LBIST procedure to ensure the design creates the predetermined MISR signatures for all the various cases (i.e. all good cores, 1 bad core, 2 bad cores, etc). Clearly the drawback here lies in the inherent complexity of assembling the necessary simulation environment to exercise all the steps involved in the LBIST sequence.

The present invention contemplates a method which permits the verification of the fencing structures without the need for exercising the complex LBIST sequence. In addition, the present invention also accommodates the multitude of latch types and latch scan connections discussed in FIGS. 4A-4B, FIGS. 5A-5C depict the method of the present invention.

Step 1 Identify Partial Good (PG) Interfaces

Figure 5A:
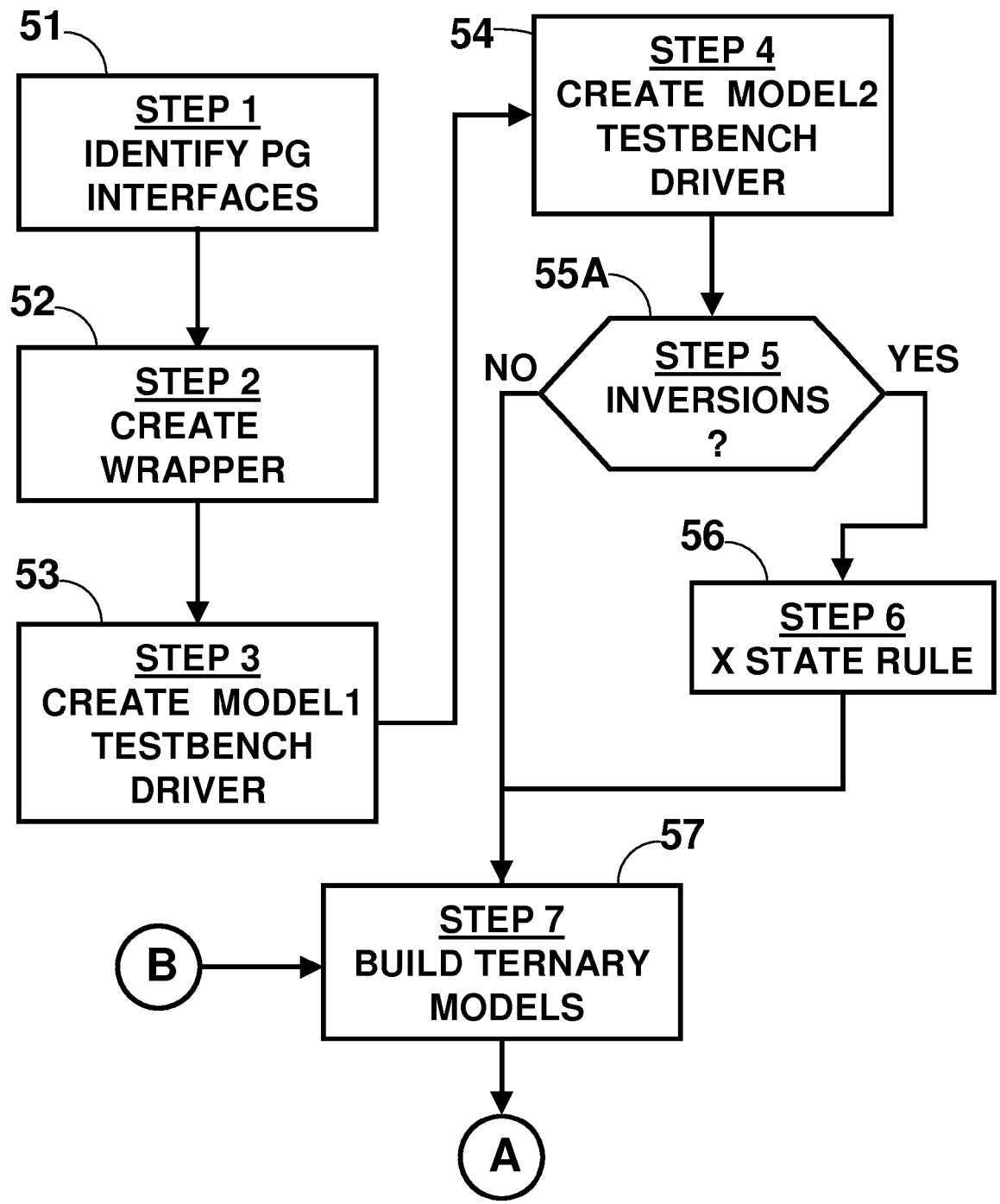
FIGS. 5A-5C illustrate the method steps of the present invention.

Turning our attention to FIG. 5A, the method begins with Step 1 Identify PG Interfaces block 51 wherein all the partial good interlaces are identified. This typically necessitates documenting the various command, address, data, and control signals, and their associated fences, for every interface that connects a partial good element (i.e. a core 11) with elements, such as the common logic block 12 in FIG. 1, that must be functional for the chip to work. This list of partial good interface signals and FENCE gating signals will be used to drive the verification model.

Step 2 Create Wrapper Schematic of Non Core Components of Common Logic Block

Create Wrapper block 52 involves creation of a wrapper schematic which includes all the design components that comprise the common logic block 12, but excludes the elements that comprise the partial good components such as the cores 11 of FIG. 1. In the preferred embodiment of this invention, using FIG. 1 as an example, this wrapper schematic would equate to all the logic comprising common logic block 12, and whose inputs and outputs are the interfaces to the four cores 11. This wrapper will serve as the basis for the verification model used in the remainder of the method steps.

The present invention contemplates the use of a formal verification environment as the means to validate the design. The formal verification environment consists of a compiled Register Transfer Level (RTL) design description which is exercised using a formal verification engine. In RTL design, behavior of a circuit is defined in terms of the data flow between registers, and the functions performed on such signals. RTL is used in Hardware Description Languages (HDL)s to create high-level representations of a circuit, from which lower-level representations and ultimately actual wiring can then be derived.

The preferred embodiment entails the use of the IBM SixthSense formal verification environment, which comprises bounded exhaustive state space exploration coupled with random simulation to obtain a formal proof of the desired assertions. The RTL design description is compiled into a formal verification model, which is exercised through the use of a plurality of testbench drivers.

Step 3 Create Model 1 Driver

Returning to FIG. 5A, Step 3 Create Model 1 Driver block 53, requires the creation of a very simple testbench driver to exercise the partial good interfaces in a fixed manner. This testbench driver interfaces with the wrapper schematic from Step 2, block 52 to force all interface signals between the core 11 and the common logic block 12 to an inactive state. Additionally, the FENCE gating signal(s) are also driven to an inactive state.

FIG. 6A illustrates a Model 1 testbench driver which is implemented in the VHSIC Hardware Description Language (HDL) known as VHDL which is employed as an electronic circuit design tool. The VHS IC (Very High Speed Integrated Circuit) Hardware Description Language is also known as VHSIC Hardware Description Language or more commonly as VHDL. VHDL is a well known tool for electronic design automation of digital circuits design-entry language for Field-Programmable Gate Arrays (FPGA) and Application-Specific Integrated Circuits (ASIC) devices. Although the preferred embodiment illustrates testbench drivers implemented m the VHDL description language, one skilled in the art can appreciate how the testbenches drivers can be implemented in Verilog or any other applicable design description language. Verilog is another (HDL) used to model electronic systems.

FIG. 6A shows the typical components of a standard VHDL design testbenches driver component. The header 70 is the standard boilerplate for VHDL defining all of the necessary libraries and packages. One skilled in the use of the VHDL language will be familiar with the usage of such statements. The second section comprises the entity declaration 71, which enumerates all the inputs and outputs of the DUT. For reasons of brevity, only the FENCE gating signal 31 and three inputs, INTF_SIG1, INTF_SIG2, NEG_INTF_SIG are shown. Any other Inputs between the cores 11 and the common logic block 12 would also be described in this section. Finally the architecture section 72 depicts each interface signal, as well as the FENCE gating signal 31, being constantly driven to an inactive state. One will notice that the two positive active signals, INTF_SIG1 and INTF_SIG2 are driven to a logic "0" while the negative active signal, NEG_INTF_SIG, is driven to a logic "1."

Step 4 Create Model 2 Testbench Driver

Returning to FIG. 5A, in Step 4 the Create Model 2 Testbench Driver block 54 is nearly identical to Step 3 block 53, except in this case the FENCE gating signal 31 is driven to an active state and the interface signals are permitted to take on random values.

FIG. 6B shows the VHDL implementation of the Model 2 Testbench Driver wherein the header 70 and the entity declaration 71 are identical to the header 70 and the entity declaration 71 of the Model 1 Testbench Driver in FIG. 6A in FIG. 6A. However the architecture section 73 in FIG. 6B is slightly different from the architecture section 72 in FIG. 6A. In this case, the FENCE gating signal 31 is forced to a logical "1" while the INTF signal 30 are driven to "X."

Step 5 Inversions ? Block

In step 5, the inversions block 55A comprises a test that is necessary to determine whether there are any known inversions in any scan chain contained in the wrapper schematic created in Step 2 block 52. Normally it is easy to determine this based on the design methodology. For example, in lower cost computer systems such as personal computers, scan chain inversions are a common means of initializing latches to non-zero values. If the answer to the inversions test 55A is YES, then proceed to Step 6 block 56 which is described below, but if the answer is NO, then the program branches to Step 7 block 57, which is described below.

Step 6, X State Rule

That test requires the Model 2 Testbench Driver block 54 of FIG. 6B to be augmented with a special rule. One of the strengths of the present invention is the use of formal verification which permits an assertion about the DUT to be mathematically proven true or false.

FIGS. 7A-7B show a continuous VHDL Model 2 testbench driver, comprising the X State Rule.

FIG. 7A shows the header 70 of FIGS. 6A and 6B but the entity declaration 71 has been replaced by a modified entity declaration section 74 that contains the same input and output signals as the Model 2 testbench driver in FIG. 6B, but also includes two additional inputs signals "macro1_misr" and "macro2_misr" as well as a new output known as "fail". The architecture section 75 of FIG. 7A which is a modification of the architecture section 73 of FIG. 6B has also been enhanced to include a new internal signal known as "misr."

FIG. 7B shows the inclusion of a new section, which is known as the Fails section 76. The preferred embodiment allows for the mapping of any facilities in the design hierarchy into accessible VHDL signal constructs. In this example, the actual MISR 23 latch is comprised of two hierarchical facilities in the design, known as "chip.macro1.lfsr_misr_srl" and "chip.macro2.lfsr_misr_srl." Both of these facilities are mapped to "macro1_misr and macro2_misr" respectively; and these new internal signals can be referenced in the Model 2 testbench driver as inputs. The X State Rule section 77 in FIG. 7B assimilates all the additional components into a formal verification rule. The "misr1_srl" and "misr2_srl" facilities representing the actual design MISR latches 23 are concatenated into temporary internal signal "misr" which was declared in the architecture section 75 in FIG. 7A. This combined facility is fed into a built-in SixthSense function which automatically monitors the facility for any "X" States in any bit of the vector. If at any point in the "fv run," an "X" propagates into any MISR bit, then output facility fail will be set to a logical "1." In the preferred embodiment, the MISR starts out at zero and should only contain combinations of zeros and ones depending on how the bits are recombined in the LFSR (Linear Feedback Shift Register) within the PRPG 22 as described above. An introduction of an "X" into the MISR indicates a "leak" in the fencing logic and would be detected with the fail event described in the X State Rule section 77. Although SixthSense, in the preferred embodiment, provides a function known as, "mvl_is_any_x" should be obvious to one skilled in the art that the function can be replaced by an explicit formal verification rule coded to test for an "X" in any bit position of the MISR.

Step 7 Build Ternary (Tri-State) Models

Continuing with FIG. 5A, if the inversion test 55A states that there are no known inversions in the scan chain, or once Step 6 is complete, then Step 7 Build Ternary Models block 57 is performed, which creates two ternary (tri-state) models. Ternary models allow all signals and latches in the model to assume a logical "0," logical "1" or the "X" state. The IBM SixthSense formal verification environment permits the use of hierarchical design components which obviate the need to flatten all of the design components comprising the DUT. Therefore, the wrapper schematic can be as simple as a single entity which instantiates a plurality of intermediate and lower level components. The present invention places no limits on the levels of hierarchy, nor does it require the use of a hierarchical design methodology. It simply requires a means by which all the constituent design components can be identified and incorporated into the build ternary models block 57.

The present invention requires building ensured that the logical structures are identical. The only difference is in how each model is stimulated using the two different testbench drivers.

Step 8 Inversions ? Block

Figure 5B:
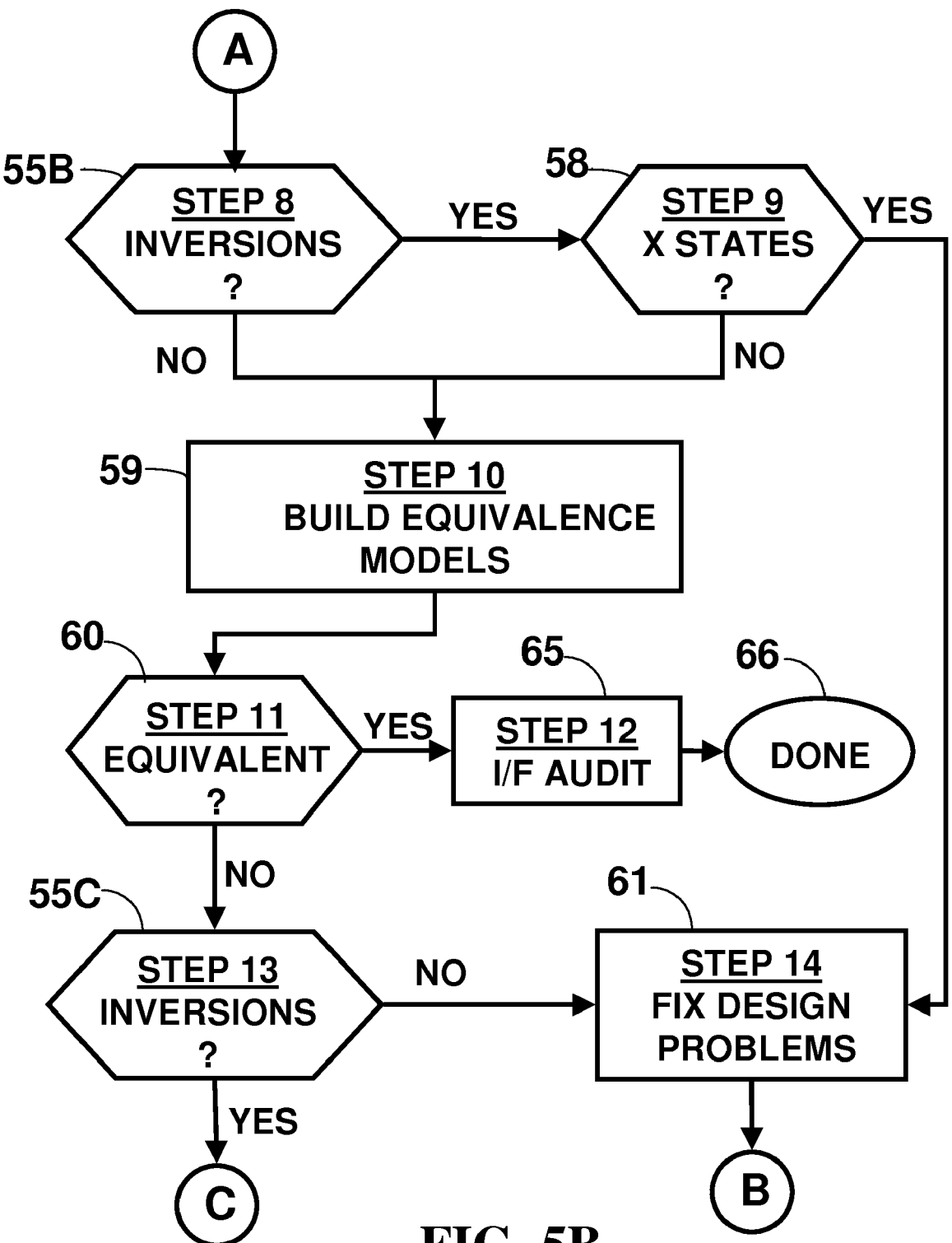
Figure 5C:
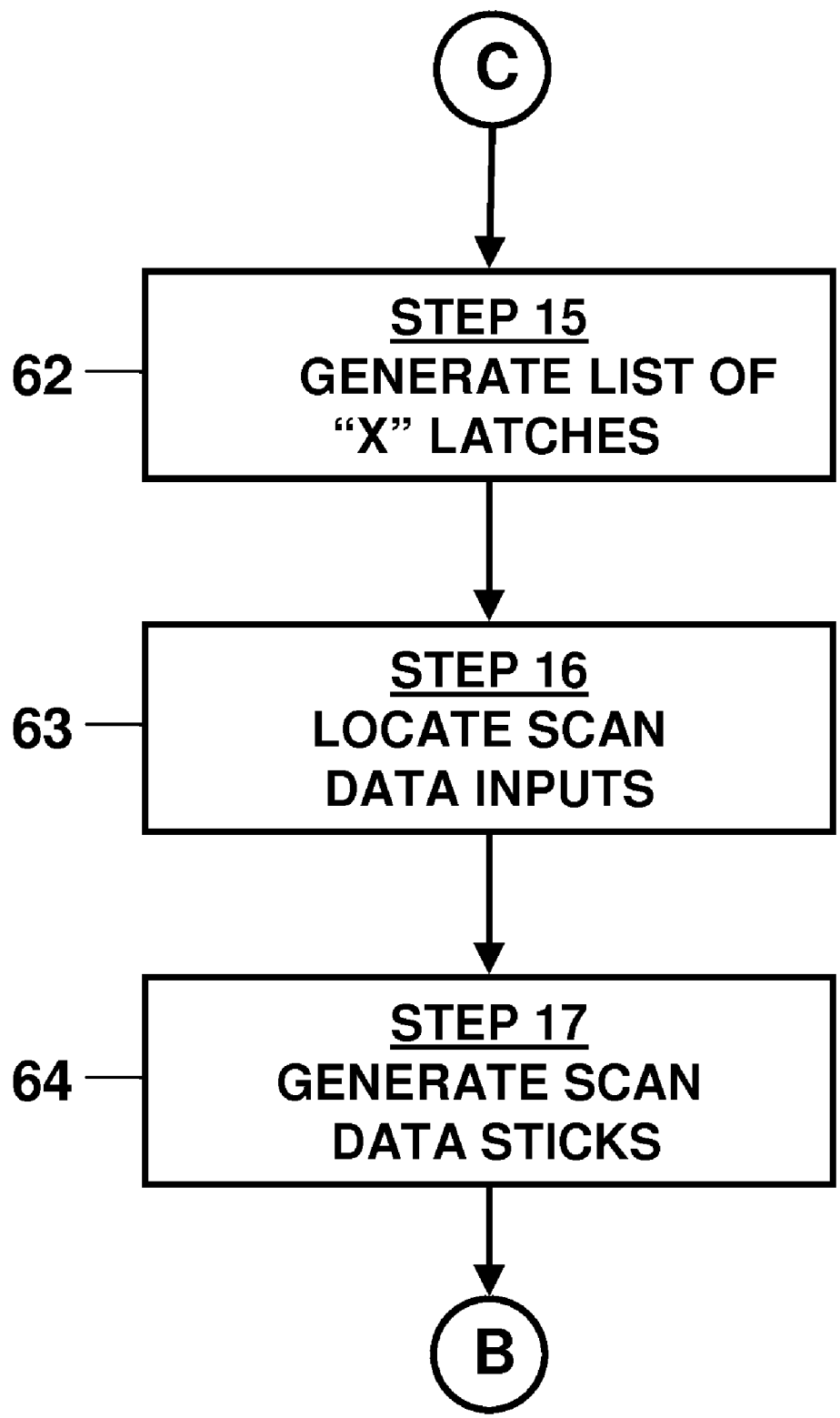

Once the ternary models are constructed at the end of step 57, the present invention proceeds via link A in FIG. 5A to Step 8 Inversions test block 55B in FIG. 5B; and then it again branches based on whether scan chain inversions are known to exist in the design.

Step 9 X States ? Block

If the result of the test in Inversions ? Block 55B in FIG. 5B is YES, then Step 9, X States block 58 must be executed to exercise the X State Rule block 56 created in Step 6. This entails using one or more formal verification engines to examine the state space of The design exhaustively to determine whether it is possible to propagate an "X" into the MISR using the Model 2 Testbench Driver. In the preferred embodiment, SixthSense permits a formal verification run to be initiated against a single rule or a plurality of rules at once. If the test Step 9 block 58 result is YES, i.e. formal verification (fv) run proves that "X" states can be propagated into the MISR, this is a positive indication of a design problem, and Step 14 is necessary to Fix the Design Problems 61 described below. Otherwise, if the test Step 9 block 58 result is NO, i.e. fv run proves "X" states cannot be propagated into the MISR 23, then the method proceeds with the Build Equivalence Models step 10 block 59 in FIG. 5B described next. p In Step 10 Build Equivalence Models block 59, that is executed either if the Step 8 block 55B inquiry determines NO, that there are no scan chain inversions in the design, or if Step 9 block 58 shows NO there are no "X" states propagating into the MISR. In Step 10 of the preferred embodiment, SixthSense creates a composite model using the testbench drivers and design components from the Model 1 and Model 2 testbench drivers. For the present invention the design content is identical in both models, therefore any signal or register in the Model 1 testbench driver is guaranteed to exist in the Model 2 testbench driver. However, in the general application, the equivalence models are typically used to prove whether two different representations of a design are logically equivalent, thereby assuring that a change made on one representation was successfully implemented in a second representation. The present invention exploits this capability of SixthSense as a means of verifying that the fencing logic is properly implemented.

In the preferred embodiment, IBM SixthSense permits the user to identify any facilities within the design as equivalence targets. The present invention requires the user to select, or otherwise to identify to the formal verification tool, the list of all MISR latches 23 which exist in the DUT (i.e. Common Logic Block 12). Just as Step 1 block 51 required identifying every signal that is asserted to be a partial good interface, along with its corresponding FENCE gating signal 31, Step 10 requires the further identification of the MISR latches 23.

Step 11 Equivalent?

The step 11 block 60 test executes a special formal verification run using the MISRs 23 of the design as the points of equivalence. The present invention is based on the premise that in a properly fenced design, the MISR 23 will not be influenced by any external signals when the FENCE gate 31 is active. This is logically equivalent to an inactive FENCE gate 31 passing an inactive INTF signal 30. The SixthSense tool will trace the design topology from the MISR bits 23 back to the INTF signals 30 and FENCE gating signals 31 and apply the testbench driver constraints from both models to test if the MISRs are a true point of equivalence. For example, if an INTF signal 30 is missing a corresponding fence gating structure 36, such as that shown in FIG. 3A, then it would create a counterexample showing the INTF signal 30 at logical "0" in Model 1 testbench driver block 53, with a corresponding MISR 23 signature, while in the Model 2 testbench driver block 54 it would set the INTF signal 30 to "X" along with a different MISR 23 signature (likely containing "X"s). Because the design topology is identical in both models, SixthSense would be able to determine the exact state of the latches and clocking sequences necessary to produce the two different MISR signatures.

One of the main advantages of the present invention is the ability to exploit the exhaustive state space exploration capability of a formal verification engine to determine any clocking sequence and corresponding latch states to produce a counterexample showing non-equivalent MISRs. This is a significant improvement over traditional verification methods of actually simulating the LBIST operational sequences to determine if the MISR can ever mismatch the predetermined "golden" signature. The operational sequences are complicated to set up and execute, and are prone to missing steps or tests.

Additionally, these complex simulation runs must be modified whenever the LBIST sequence is altered or enhanced, thereby creating the potential for a false positive result because the verification was exercised using an obsolete sequence. By relying on the mathematical equivalence algorithms embedded in the formal verification engine to demonstrate that the design is logically equivalent in the two modes of operations, the verification can be performed independently of changes in the LBIST procedures. The verification engineer or designer responsible for this task also needs no knowledge of the LBIST procedures which enables this type of verification to be exercised by a myriad of resource.

Returning to FIG. 5B, if the "fv run test" in Step 11 "Equivalent?" block 60 determines YES, then the MISRs 23 are equivalent, and the method branches to step 12 in block 65, described below. Otherwise if the Step 11 test determines NO, as the MISRs 23 are not equivalent, then the method proceeds to Step 13 block 55C, which branches again based on the existence of inversions in the scan chain. The absence of inversions is a guarantee that the non-equivalence is a real design problem, and thus Step 14 is employed to Fix the Design Problem 61. In the preferred embodiment, SixthSense produces visual signal traces for each counterexample it finds. This enables the user to quickly see which MISR bits miscompare, and enables the user to trace back through the appropriate logic to determine the point of deviation between the two models. This point of deviation is usually the result of a missing or improperly implemented fencing structure. Once the problem has been identified and fixed, the method returns via link B to Step 7 Build Ternary Models block 57 in FIG. 5A, and the process repeats in order to incorporate the fixes into the model and to try again to prove equivalence.

Figure 8:
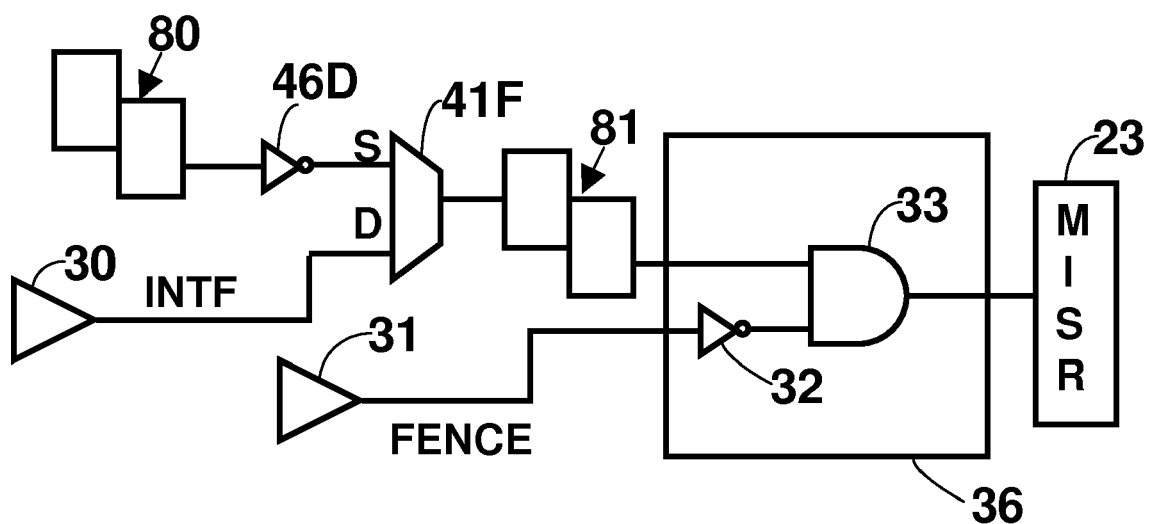
FIG. 8 depicts an example of a false fail which can arise when the Design Under Test (DUT) contains scan chain inversions.

In the event scan chain inversions do exist, the method described herein presents the potential for a false non-equivalence to materialize. One example of such a false non-equivalence is illustrated in FIG. 8. Here it can be seen that the interface signal INTF 30 feeds the data port of latch 81. The output of the latch 81 is combined with the FENCE 31 in the fencing logic 36 that was described earlier. The output of the fencing logic eventually combines into the MISR 23 signature.

In Model 1, the line INTF 30 is driven to logic "0," which forces the latch 81 to be zero for all scenarios where the multiplexer 41F selects the data input over the scan input. The existence of a "0" in latch 81 is crucial to ensuring the point of equivalence at the MISR 23. However, SixthSense is permitted to control the clocks in any possible manner to exhaust all state spaces. This means that it will likely generate a sequence in which the scan path into latch 81 is selected by multiplexer 41F. FIG. 8 includes an inverter 46D in the scan chain, between the latch 80 and the latch 81. One can see that a zero residing in the latch 80 would propagate through the inverted scan chain into latch 81 as a logical "1." If this occurs in a Step 3 Model 1 trace, the logical "1" will propagate through the fencing structure and into the MISR 23. Recall that in Step 4 Model 2, the FENCE gating signal 31 is held active at all times, thereby ensuring that a logical "0" is propagated into the MISR 23. This non-equivalence is not a result of an improperly designed fencing structure; but it is due to the scan chain inversion creating an undesirable logical "1" in Model 1.

In order to circumvent such "false fails", the present invention includes additional method steps, which must be executed when Step 11 block 60 finds that Model 1 and Model 2 are not equivalent; and that inversions exist in the scan chain. It begins with Step 15 Generate List of "X" Latches (62) in FIG. 5C. This step creates a list of all the latches in the DUT that either may encounter, or have encountered, an "X" during Step 6, "X" State Rules block 56. The rule exercised in Step 6 is designed to prove whether any "X" states can propagate into the MISR 23 when partial FENCE gating signals 31 are active. Since these "X"s are introduced only at the partial good interfaces, it follows that all latches through which an "X" was propagated, or may propagate, must exist somewhere in the design topology that connects the partial good interfaces to the MISR 23. Any latches in a completely independent cone of logic would never see an "X".

Therefore, by tracking all latches in which "X"s could, or do, materialize, one can discern all the candidates that can contribute to a false fail such as that described in FIG. 8. In the preferred embodiment, the list of latches which may contain "X"s is generated by running a scan chain traversal program and listing all latches that are found to be connected to a scan chain inversion, such as latch (81), in FIG. 8. However, one skilled in the art would appreciate how such a list can be generated in numerous ways, including, but not limited to, the use of a netlist traversal program to identify all the latches in the cones of logic connecting the partial good interfaces which is cited in Step 1 block 51 with the MISR 23, or even employing the formal verification tool itself to monitor "X" state propagation during Step 6 "X" State Rules block 56 and generating a list of the latches.

Next, in Step 16 entitled Locate Scan Data Inputs 63 the system is enlisted to determine the exact facility name in the equivalence model which corresponds to the scan data input (i.e. the "S" pin of the multiplexer 41 in FIG. 8). Step 17 Generate Scan Data Sticks 64 follows by employing the output list from Step 16 Locate Scan Data Inputs 63 to create an override list. In the override list, all identified scan data inputs are forced to logical "0." In the preferred embodiment, SixthSense employs a model traversal utility which enables the user to query the facility of any latch pin in a formal verification model. Thus, given a list of latches with "X" states, the list of associated scan inputs can be easily constructed. This list is then converted into an override list which is passed to SixthSense during any subsequent model equivalence runs. All facilities in the override list are kept at a constant value defined by the override list for the duration of the equivalence run.

The method of the present invention permits false fails of the type identified in FIG. 8 to be circumvented by using step 15 block 62 thru step 17 block 64 to create an override list of all the scan inputs of latches wherein "X" states have appeared. Then Step 7 block 57 is executed again to rebuild the ternary models using the override list. Another equivalence run is performed, this time with any inversions in the scan chain being overridden by the override file created in Step 17 block 64. Therefore, using the previous example described in FIG. 8, one can see how it is no longer possible for a logical "1" to be introduced through the scan chain inversion in Model 1, and cause a false MISR non-equivalence.

Returning to FIG. 5B, all of the paths in the method steps of the present invention, lead eventually to a valid design implementation which results in equivalence in Step 11 block 60. At this point, the formal verification is complete, but our method further contemplates a potential escape addressed by Step 12 I/F Audit 65. In this step, the partial good interfaces and fencing signals identified in Step 1 block 51 are audited against the latest version of the design netlist to ensure all partial good interfaces are being tested. One danger of the present invention is the possibility that a signal could be improperly communicated or undocumented, thereby resulting in no verification of the signal. If the signal has an improperly gated FENCE piling signal 31 (or no FENCE gating signal at all), Step 11 Equivalent ? block 60 could still render a positive verification, yet the design would not work properly during chip fabrication test. After Step 12 I/F Audit 65 the program goes to the DONE block 66.

The present invention protects against this problem by using the design netlist to create a list of all signals entering the common logic 12 from partial good cores 11. Then it compares the list of signals to all the signals being driven in the Model 1 testbench driver. Any signal that exists in the netlist, but is absent from the testbench driver must be reviewed and understood as to why it is being excluded from the testbench driver. This protects against the scenario in which Step 1 block 51 was executed early on in the design phase; and a new signal was subsequently added between the core 11 and common logic block 12, but the testbench driver was never amended. Conversely, it may sometimes be necessary to drive additional facilities in the testbench driver, e.g. configuration or mode settings, to obtain a formal proof. Again the I/F Audit step 65 would detect this as facilities found in the testbench driver, but missing from the design netlist. The present invention contemplates a review of the facilities to ensure the formal proof was legitimately realized. Upon completion of the audit, the verification method is finished.

Another advantage to the present invention is the use of a formal verification model to prove logical equivalence between Model 1 and Model 2 testbench drivers in addition to exercising rules which verify that "X" states are unable to propagate into the MISR 23. One might assume that a formal proof indicating that "X"s asserted onto the partial good interfaces in the Model 2 testbench driver cannot be propagated into the MISR is a sufficient proof of proper fencing implementation. Although it is true that such a proof guarantees all partial good interfaces are properly gated, it does not provide a means for detecting over fencing.

Figure 9:
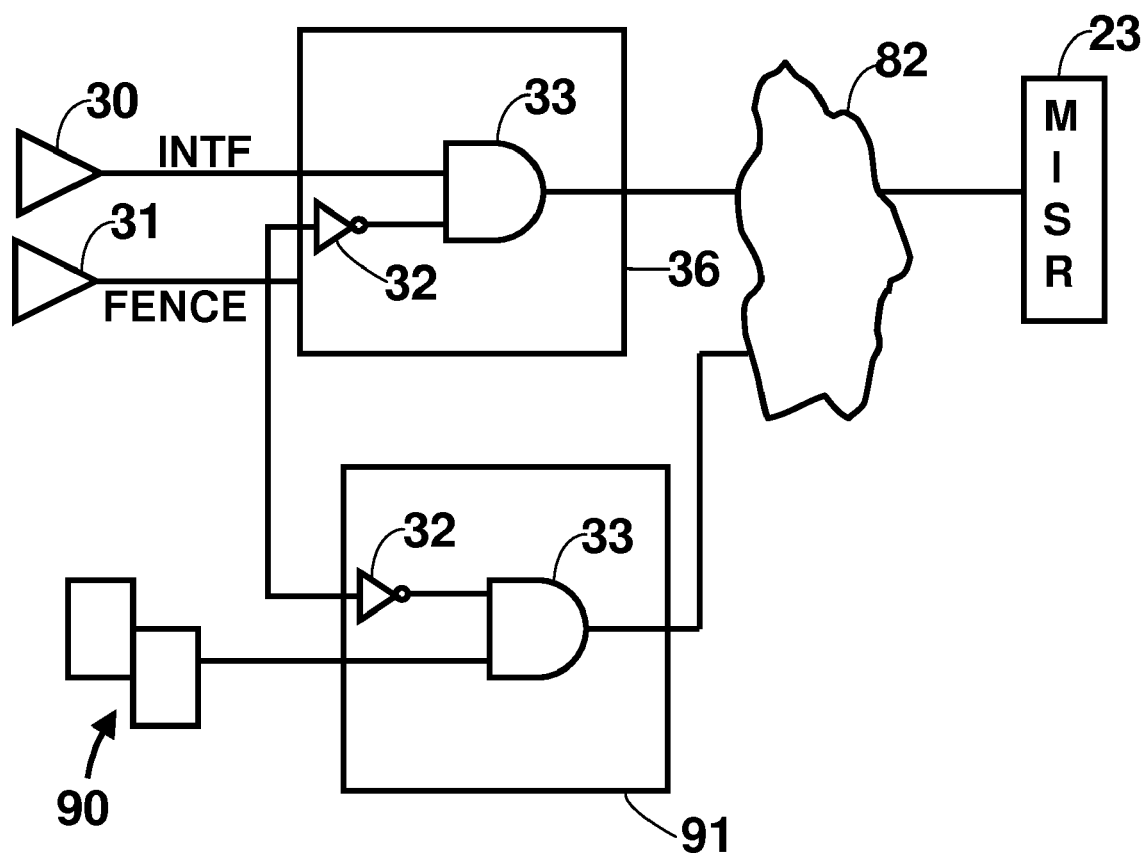
FIG. 9 illustrates an over fencing situation, that potentially reduces chip test coverage.

FIG. 9 depicts an illustration of an over fencing situation. An interface signal, INTF signal from gate 30, and the FENCE gating signal 31 are combined in the fencing logic structure 36, comprising the AND gate 33 and INVERTER 32 previously described with reference to FIG. 3A. This structure would be fully validated using the "X" State Rule in Step 6 block 56. However, FIG. 9 also shows the same FENCE gating signal 31 entering a fencing structure 91, which is employed to gate a local latch 90. The local latch 90, which has no association with any partial good interlaces, comprises an internal latch that is normally isolated from all interfaces. The inclusion of FENCE gating signal 31 through the use of extraneous fencing logic 91 results in reduced test coverage of the internal common logic block 12 of FIG. 1 during situations where one or more cores 11 must be disabled due to defects. One can envision how latch 90 can be replaced with substantial pieces of logic, which if erroneously gated by partial good FENCE gating signals, can substantially reduce the chip test coverage to an undesirable level.

Since local latch 90 is not part of the interfaces identified in Step 1 block 51, it is not being exercised in the Model 1 or Model 2 testbench driver. Thus, extraneous fencing logic 91 is not exercised during the X State Rule in Step 6 block 56. Simply exercising a formal verification rule testing for "X" states in the MISR 23 would not detect the extraneous fencing. However, the present invention will uncover this superfluous fencing structure via the equivalence checking from Step 11 block 60 of FIG. 5B described earlier. This will detect that the output of logic fencing structure 91 will always be zero in the Model 2, testbench driver, with the fence gate 31 active, but can fluctuate in the Model 1 testbench driver as latch 90 is permitted to take on all possible state space values. Thus a counterexample will be created to disclose this over fencing situation and permit it to be rectified.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device can be provided that is readable by a machine, tangibly embodying at least one program of instructions executable by the machine to perform the capabilities of the present invention.

The flow diagrams depicted herein are just examples. There may be many variations to these diagrams or the steps (or operations) described therein without departing from the spirit of the invention. For instance, the steps may be performed in a differing order, or steps may be added, deleted, or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for permitting the verification of Built In Self Test (BIST) structures within an integrated circuit of a logical interface group of circuits having an output, comprising:

determining that at least one node of the integrated circuit comprises a point of equivalence wherein the output of the logical interface group comprises at least one fence gating signal and one or more interface signals;

building two ternary models with a first ternary model comprising a wrapper schematic including a Design Under Test (DUT) along with a Model 1 testbench driver and a second ternary model comprising the wrapper schematic, the DUT and a Model 2 testbench driver;

building a composite equivalence model which is a union of the first ternary model and the second ternary model wherein all interfaces specified in the first ternary model are driven using the Model 1 testbench driver and all interfaces specified in the second ternary model are driven using the Model 2 testbench driver and any interface not specified in either the Model 1 testbench or the Model 2 testbench driver is driven identically in both the first ternary model and the second ternary model; and identifying nodes in the DUT to serve as points of equivalence which are asserted to be mathematically equivalent.

2. The method of claim 1 further comprising the steps of:

employing a formal verification engine to obtain said mathematical proof; and formally verifying a plurality of logical interface groups in parallel within a single formal verification execution run.

3. The method of claim 1 further comprising the steps of:

identifying the interface signals and corresponding FENCE gating signals for one or more interfaces; and creating the wrapper schematic which includes the DUT containing logic circuitry common to the interfaces but excludes the elements responsible for driving the interfaces.

4. The method of claim 3 further comprising the steps of:

creating the Model 1 testbench driver wherein the interface signals and the corresponding FENCE gating signals are driven to an inactive state and;

creating the Model 2 testbench driver wherein the interface signals are driven to random or "X" states and the corresponding FENCE signals are driven to an active state.

5. A method for permitting the verification of Built In Self Test (BIST) structures within an integrated circuit of a logical interface group of circuits having an output, comprising the steps of:

determining that at least one node of the integrated circuit comprises a point of equivalence wherein the output of the logical interface group comprises at least one fence gating signal and one or more interface signals;

employing a formal verification engine to prove that a logical output comprises a point of equivalence providing a successful mathematical proof that a the point of equivalence corresponds to a complete and exhaustive validation of fencing circuitry in a corresponding logical interface group;

formally verifying a plurality of logical interface groups in parallel within a single formal verification execution run;

identifying interface signals and corresponding FENCE gating signals for one or more interfaces;

creating a wrapper schematic which includes a Design Under Test (DUT) containing logic circuitry common to interfaces but excludes elements responsible for driving the interfaces;

creating a Model 1 testbench driver wherein the interface signals and the corresponding FENCE gating signals are driven to an inactive state and;

creating a Model 2 testbench driver wherein the interface signals are driven to random or "X" states and the corresponding FENCE signals are driven to an active state;

building two ternary models with a first ternary model comprising the wrapper schematic including the DUT along with said Model 1 testbench driver and a second ternary model comprising the wrapper schematic, said DUT, and incorporating said Model 2 testbench driver;

building a composite equivalence model which is a union of the first and second ternary models wherein all interfaces specified in the first ternary model are driven using said Model 1 testbench driver and all interfaces specified in the second ternary model are driven using said Model 2 testbench driver and any interface not specified in either of the testbench drivers is driven identically in both of the models; and identifying nodes in said DUT to serve as points of equivalence which are asserted to be mathematically equivalent.

6. The method of claim 5 further comprising the steps of:

exercising the composite equivalence model using a formal verification engine to determine if the asserted points of equivalence are mathematically equivalent;

examining the output of the formal verification run to determine whether all points of equivalence were proven to be equivalent thereby signifying an exhaustive validation of said logical interface groups; and further determining whether any points of equivalence are non equivalent thereby signifying a potential design problem.

7. The method of claim 6 further comprising the steps of:

determining whether scan chain inversions exist in the DUT; incorporating additional formal verification rules into the Model 2 testbench driver to test the scan chain inversions for propagation of an "X" state through the DUT and into the points of equivalence, and wherein successful propagation of an "X" state into the points of equivalence denotes a design problem and further comprising the steps as follows:

eliminating potential false fails in the formal verification of the composite model by identifying all latches connected to scan chain inversions and further identifying the signal names of all scan chain input nets associated with the latches and creating an override facility to force the scan chain input signals to an inactive state during the formal verification run of the composite model;

repeating the formal verification run of the composite model incorporating the override facility and determining if any points of equivalence are not equivalent thereby signifying a design problem; and determining if all points of equivalence are proven equivalent thereby signifying an exhaustive validation of the logical interface groups.

8. The method of claim 7 wherein the method supports the logical interface groups containing one or more scan chain inversions.

9. The method of claim 7 wherein the method supports the logical interface groups containing one or more inverted latches.

10. The method of claim 7 further comprising method steps that permit complete verification of the logical interface groups utilizing simple testbenches thereby obviating the need to exercise complex operational sequences or procedures such as, but not limited, to Logic Built In Self Test (LBIST).

11. The method of claim 10 further comprising the step of utilizing at least one Multiple Input Signature Register (MISR) as at least one point of equivalence for the purpose of verifying the fencing circuitry incorporated in partial good Logical Built In Self Test (LBIST) applications.

12. The method of claim 11 further comprising the step of providing a means of testing for "X" state propagation to at least one point of equivalence using a simple formal verification rule and without requiring any knowledge of design netlist topology.

13. The method of claim 11 further comprising the step of providing a means of detecting over-fencing situations wherein interface FENCE gating signals are erroneously gating non-interface circuitry, thereby potentially reducing test coverage.

14. The method of claim 11 further comprising the step of performing an interface signal audit to ensure the Model 1 and Model 2 testbench drivers have incorporated all required interface signals and to further ensure all the interface signals have been exhaustively verified.

15. The method of claim 11 further comprising the step of providing scalable steps capable of executing against a plurality of design components which may range in size in complexity, but wherein the method scales with the design without requiring additional complexity.

16. A system for verifying Built In Self Test (BIST) structures within an integrated circuit of a logical interface group of circuits having an output, the system comprising a formal verification engine for proving that a chosen reference point in a design is logically equivalent when the design is compared under two modes of operations including a Logic Built-In Self Test (LBIST) controller:

model drivers capable of building two ternary models with a first ternary model comprising a wrapper schematic including a Design Under Test (DUT) along with a Model 1 testbench driver and a second ternary model comprising the wrapper schematic, the DUT, and incorporating a Model 2 testbench driver;

the model drivers capable of building a composite equivalence model which is the union of the ternary models wherein all interfaces specified in the first ternary model are driven using the Model 1 testbench driver and all interfaces specified in the second ternary model are driven using the Model 2 testbench driver and any interface not specified in either of the testbench drivers is driven identically in both models; and equivalence testing means for identifying nodes in the DUT to serve as points of equivalence which are asserted to be mathematically equivalent, the means for determining that at least one node of said integrated circuit comprises a point of equivalence wherein said output of said logical interface group comprises at least one fence gating signal and one or more interface signals.

17. The system of claim 16 further comprising:

said formal verification engine providing a mathematical proof; and verification means for verifying a plurality of logical interface groups in parallel within a single formal verification execution run.

18. The system of claim 16 further comprising:

identifying means for identifying the interface signals and corresponding FENCE gating signals for one or more interfaces; and wrapper means for creating the wrapper schematic which includes the DUT containing logic circuitry common to the interfaces but excludes elements responsible for driving the interfaces.

19. The system of claim 18 further comprising:

first model means for creating the Model 1 testbench driver wherein the interface signals and the corresponding FENCE gating signals are driven to an inactive state, and;

second model means for creating the Model 2 testbench driver wherein the interface signals are driven to random or "X" states and the corresponding FENCE signals are driven to an active state.

* * * * *